(12) United States Patent
Murray et al.

(10) Patent No.: US 11,026,506 B1
(45) Date of Patent: Jun. 8, 2021

(54) MODULAR COLLABORATIVE DESK SYSTEM

(71) Applicant: Academia Furniture Industries, Wood-Ridge, NJ (US)

(72) Inventors: Thomas Murray, Philadelphia, PA (US); Christopher Murray, Philadelphia, PA (US)

(73) Assignee: Academia Furniture Industries, Wood-Ridge, NJ (US)

( * ) Notice: Subject to any disclaimer, the term of this patent is extended or adjusted under 35 U.S.C. 154(b) by 0 days.

(21) Appl. No.: 16/745,686

(22) Filed: Jan. 17, 2020

(51) Int. Cl.
*A47B 13/00* (2006.01)
*A47B 13/08* (2006.01)
*G06F 30/10* (2020.01)
*A47B 13/10* (2006.01)

(52) U.S. Cl.
CPC ............ *A47B 13/088* (2013.01); *A47B 13/10* (2013.01); *G06F 30/10* (2020.01); *A47B 2200/0003* (2013.01)

(58) Field of Classification Search
CPC ....... A47B 13/088; A47B 13/08; A47B 13/10; A47B 2200/0003; A47B 7/00; A47B 87/00; G06F 30/10; E04B 2002/7483; E04B 2002/74831
USPC ..................... 108/19, 12, 18, 64–66, 69, 25; D6/707.22, 336
See application file for complete search history.

(56) References Cited

U.S. PATENT DOCUMENTS

| | | | | | |
|---|---|---|---|---|---|
| 2,640,750 | A | * | 6/1953 | Rohde ..................... | A47B 13/10 108/161 |
| 5,676,068 | A | * | 10/1997 | Kallander ............... | A47B 13/10 108/64 |
| 7,281,476 | B2 | * | 10/2007 | Mills ....................... | A47B 41/00 108/101 |
| D554,921 | S | * | 11/2007 | Gordon .................... | D6/707.22 |
| D834,865 | S | * | 12/2018 | Godwin .................... | D6/707.22 |

(Continued)

FOREIGN PATENT DOCUMENTS

| DE | 3341535 | * | 5/1985 |
|---|---|---|---|
| DE | 19652108 | * | 6/1998 |

(Continued)

OTHER PUBLICATIONS

English translation for FR3063618 (Year: 2018).*
English translation for DE29808054 (Year: 1998).*

*Primary Examiner* — Janet M Wilkens
(74) *Attorney, Agent, or Firm* — Weiss & Arons LLP; Michael A. Springs, Esq.

(57) ABSTRACT

Apparatus and methods for providing a collaborative desk are provided. The collaborative desk may include a top surface bound by six edges, edges A-F. Each edge may define a reference line. Edge A may define a first reference line. Edge B may define a second reference line that may be substantially perpendicular to the first reference line. Edge C may define a third reference line that may be substantially perpendicular to the first reference line. Edge D may define a fourth reference line that may form an obtuse interior angle with the second reference line. Edge E may define a fifth reference line that may form a reflex interior angle with the third reference line. Edge F may define a sixth reference line that may form an obtuse interior angle with the fifth reference line and an interior angle substantially perpendicular with the fourth reference line.

4 Claims, 16 Drawing Sheets

(56) References Cited

U.S. PATENT DOCUMENTS

| | | | | |
|---|---|---|---|---|
| D861,404 S | * | 10/2019 | Ochsenfeld | D6/707.22 |
| 2005/0016080 A1 | * | 1/2005 | Williams | E04B 2/7416 |
| | | | | 52/36.1 |
| 2020/0187636 A1 | * | 6/2020 | Ochsenfeld | A47B 13/10 |

FOREIGN PATENT DOCUMENTS

| | | | |
|---|---|---|---|
| DE | 29808054 | * | 7/1998 |
| DE | 10039071 | * | 2/2002 |
| DE | 202017105463 | * | 1/2018 |
| FR | 3025079 | * | 3/2017 |
| FR | 3063618 | * | 9/2018 |
| GB | 847190 | * | 9/1960 |
| JP | 200441348 | * | 2/2002 |

\* cited by examiner

MODULAR COLLABORATIVE DESK SYSTEM

FIELD OF TECHNOLOGY

Aspects of the disclosure relate to methods and apparatus for providing a modular collaborative desk system.

BACKGROUND OF THE DISCLOSURE

Functional furniture plays an important role in many work environments. Well-designed functional furniture may take into account a user's needs and enable the user to perform tasks with maximum efficiency.

Academic, educational, and creative environments are some examples of areas that benefit from efficient, well-designed furniture. For example, a desk that is designed with specific tasks in mind may increase the productivity of a student, designer, engineer, researcher, or other user performing those tasks.

One feature that may be valuable to a user is the ability to collaborate with other users. A student may wish to study, or work on a project, with other students. A member of a design team may wish to engage with team members on a design. However, conventional desks that are designed to be used individually typically do not provide the ability to be used efficiently in combination with other such desks. For example, an ordinary rectangular desk may be well suited for individual use. When arranged with two or three other rectangular desks though, the ensuing formation generally leaves the users far apart from and/or not directly facing each other. Moreover, these formations generally create large pockets of unusable space and form an unwieldly footprint that does not allow for maximum space utilization. This is especially problematic when space is limited, such as in a typical classroom. These deficiencies make working and collaborating difficult.

It would be desirable, therefore, to provide apparatus and methods for a modular system of collaborative desks. The collaborative desks should preferably be usable individually, and also provide a collaborative tool by combining efficiently with other collaborative desks.

SUMMARY OF THE DISCLOSURE

Aspects of the disclosure relate to a collaborative desk configured to be usable alone and in a plurality of combinations with other collaborative desks. The collaborative desk may include a desktop bound by six edges and six corners. The six corners may include five exterior corners and one interior corner. Each of the six corners may join two of the edges. Each edge of the six edges may define a reference line. The reference line may be an imaginary line drawn along each edge.

The six edges and six corners may include edges A-F. Edge A may define a first reference line. Edge B may define a second reference line that may be substantially perpendicular to the first reference line. Corner AB may join edges A and B. Edge C may define a third reference line that may be substantially perpendicular to the first reference line and substantially parallel to the second reference line. Corner AC may join edges A and C.

Edge D may define a fourth reference line that may form an obtuse interior angle with the second reference line. Corner BD may join edges B and D. Edge E may define a fifth reference line that may form a reflex interior angle with the third reference line. Corner CE may join edges C and E. Corner CE may be the one interior corner. Edge F may define a sixth reference line. Corner EF may join edges E and F. Corner DF may join edges D and F.

The collaborative desk may be configured to be used by a user facing edge C. Edges A, B, and C may encompass a primary portion of the desktop. Edges D, E, and F may encompass an extension flange portion of the desktop. The extension flange may provide additional workspace adjacent to the primary portion.

BRIEF DESCRIPTION OF THE DRAWINGS

The objects and advantages of the disclosure will be apparent upon consideration of the following detailed description, taken in conjunction with the accompanying drawings, in which like reference characters refer to like parts throughout, and in which.

DETAILED DESCRIPTION OF THE DISCLOSURE

Apparatus and methods described herein are illustrative. Apparatus and methods in accordance with this disclosure will be described in connection with the figures, which form a part hereof. The figures show illustrative features of apparatus and method steps in accordance with the principles of this disclosure. It is understood that other embodiments may be utilized, and that structural, functional, and procedural modifications may be made without departing from the scope and spirit of the present disclosure.

A modular collaborative desk system is provided. Each collaborative desk may be configured to be usable alone and also to be usable in a plurality of combinations with other collaborative desks. For example, in one preferred embodiment, the collaborative desk may be configured to be used individually and also at least in arrangements of 2, 3, and 4 collaborative desks. Moreover, the collaborative desk may be usable in the plurality of arrangements in a way that minimizes dead space, brings collaborating users in close proximity and in direct positioning with each other, and provides an efficient footprint that maximizes space utilization.

Figure 1:
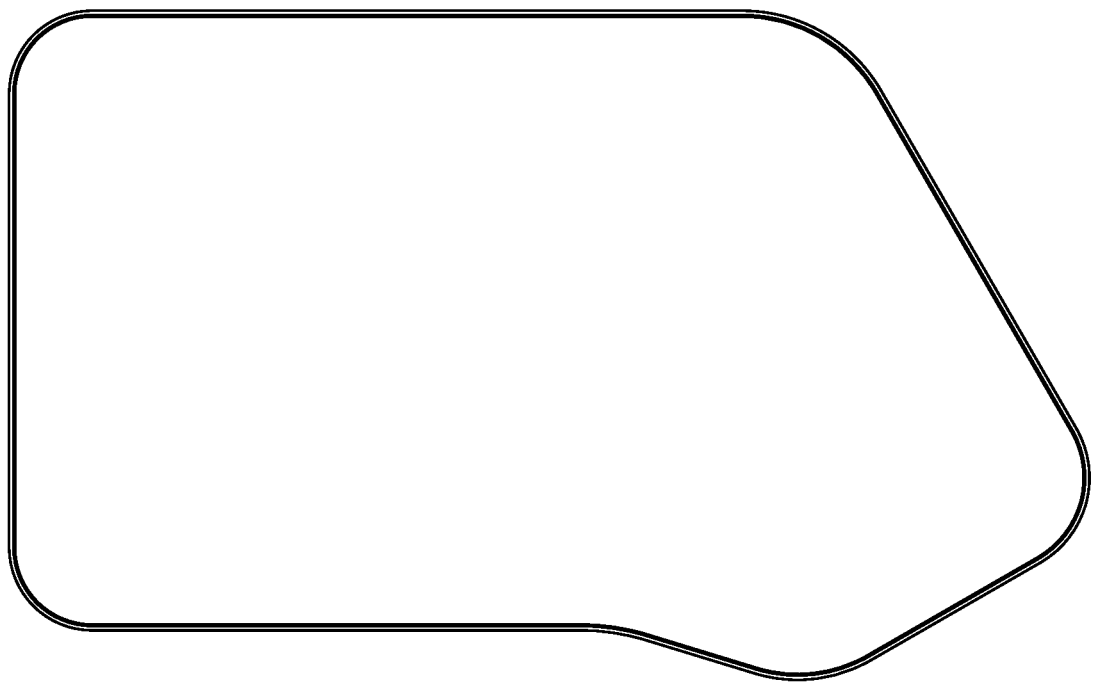
FIG. 1 shows an illustrative apparatus in accordance with principles of the disclosure.

The collaborative desk may include a desktop. FIG. 1 shows a top view of an illustrative desktop 100. The desktop may include, or may alternatively be referred to as, a top surface of the collaborative desk. The desktop may be bound by six edges. Each edge of the six edges may define a reference line. The reference line may be an imaginary line drawn along each edge.

The edges may be joined by corners. In some embodiments, the corners may be rounded. The corners may include five exterior corners and one interior corner. An exterior corner may be concave with respect to the interior of the desktop. An interior corner may be convex with respect to the interior of the desktop.

Figure 2:
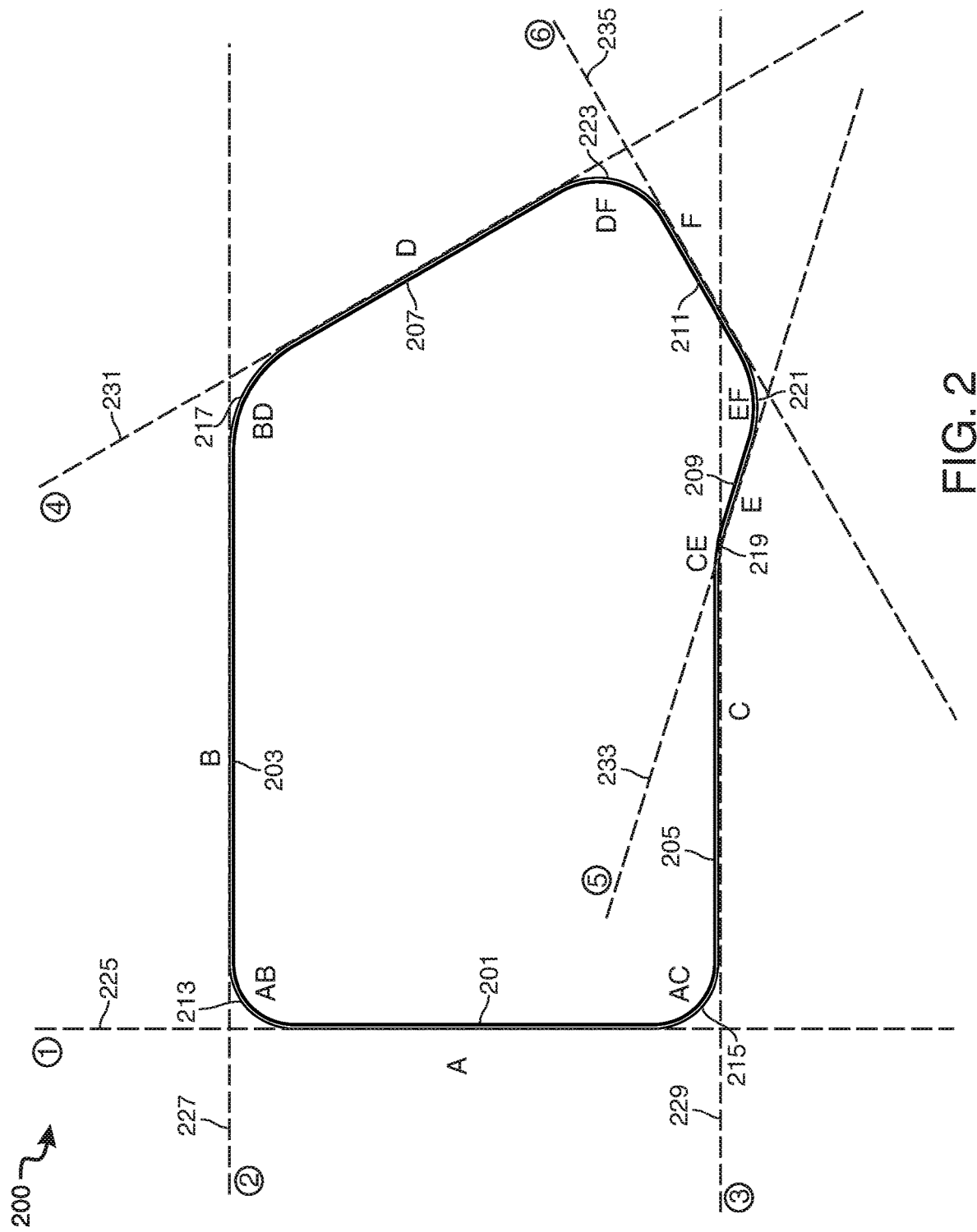
FIG. 2 shows another illustrative apparatus in accordance with principles of the disclosure.

The six edges may be labeled edges A-F. FIG. 2 shows a top view of an illustrative desktop 200 with labeled edges and corners, and with imaginary lines drawn along each edge to show the reference lines. Edge A (201) may define a first reference line (225). Edge B (203) may define a second reference line (227). Corner AB (213) may join edges A and B.

Edge C (205) may define a third reference line (229). Corner AC (215) may join edges A and C. Edge D (207) may define a fourth reference line (231). Corner BD (217) may join edges B and D. Edge E (209) may define a fifth reference line (233). Corner CE (219) may join edges C and E. Corner CE may be the one interior corner. Edge F (211) may define a sixth reference line (235). Corner EF (221) may join edges E and F. Corner DF (223) may join edges D and F.

Edges A, B, and C may encompass a primary portion of the desktop. Edges D, E, and F may encompass an extension flange portion of the desktop. The extension flange may provide additional workspace adjacent to the primary portion. The boundary between the primary portion and the extension flange may be a line drawn between corners CE and BD.

Figure 3:
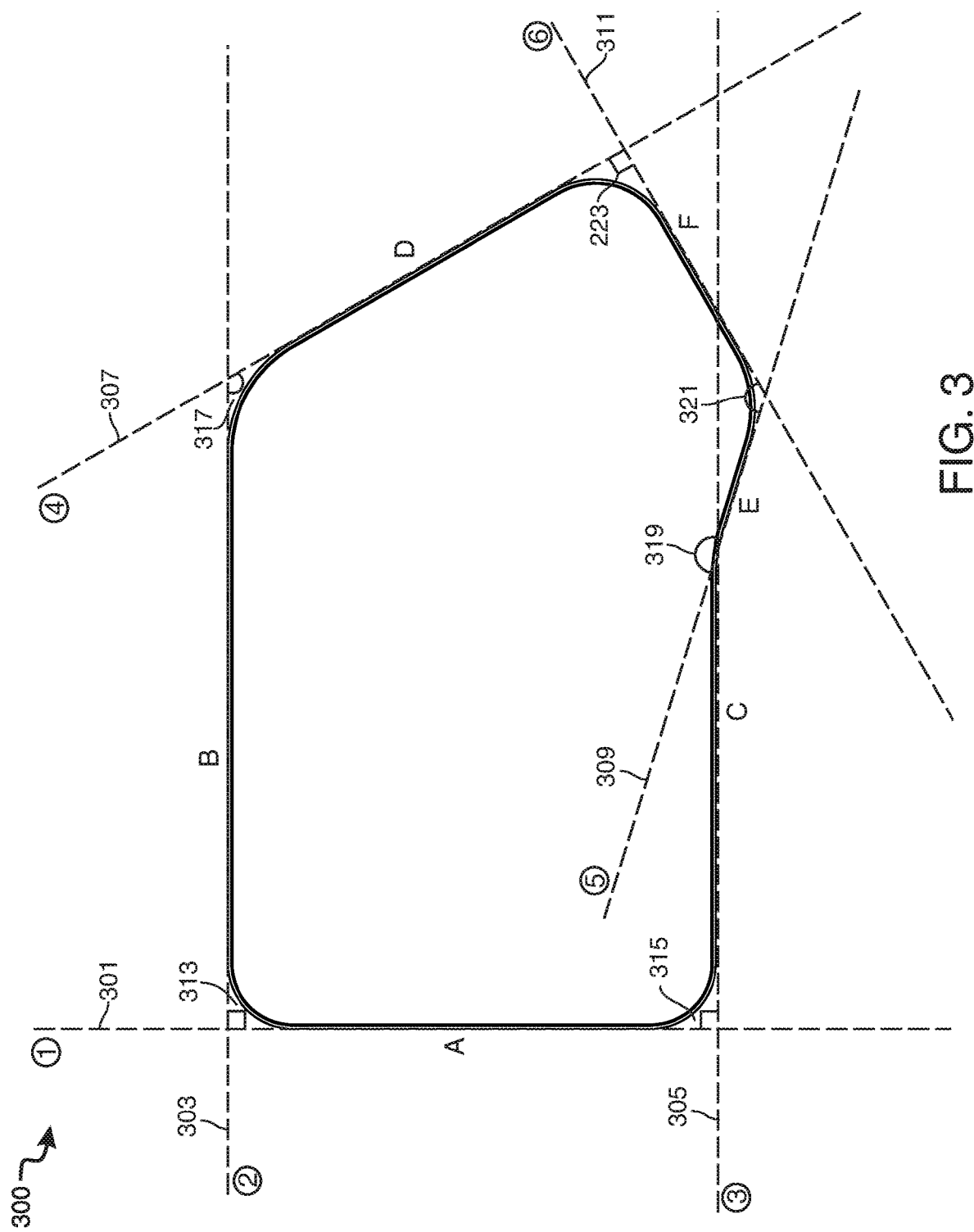
FIG. 3 shows yet another illustrative apparatus in accordance with principles of the disclosure.

The reference lines may intersect with each other in various ways to form specific angles. FIG. 3 shows a top view of illustrative desktop 300 along with exemplary angles formed by intersecting reference lines.

The second reference line (303) may be substantially perpendicular (313) to the first reference line (301). In some embodiments, the second reference line may be within 5 or 10 degrees of perpendicular to the first reference line.

The third reference (305) line may be substantially perpendicular (315) to the first reference line, and/or substantially parallel to the second reference line. In some embodiments, the third reference line may be within 5 or 10 degrees of perpendicular to the first reference line, and/or within 5 or 10 degrees of parallel to the second reference line.

The fourth reference line (307) may form an obtuse interior angle (317) with the second reference line. An obtuse angle may be an angle that is between 90 and 180 degrees. An interior angle may be the angle formed by the intersecting reference lines that faces the interior of the desktop.

The fifth reference line (309) may form a reflex interior angle (319) with the third reference line. A reflex angle may be an angle that is between 180 and 360 degrees. The sixth reference line (311) may form an obtuse interior angle (321) with the fifth reference line. The sixth reference line may also form an interior angle (323) with the fourth reference line.

The collaborative desk may be associated with certain specific angles or angle ranges. For example, the obtuse interior angle (317) that may be formed by the fourth reference line and the second reference line may measure between 110 and 130 degrees. In a preferred embodiment, interior angle 317 may be precisely or approximately 120 degrees. The reflex interior angle (319) that may be formed by the fifth reference line and the third reference line may measure between 190 and 210 degrees. In a preferred embodiment, interior angle 319 may be precisely or approximately 198 degrees. The obtuse interior angle (321) that may be formed by the sixth reference line and the fifth reference line may measure between 120 and 140 degrees. In a preferred embodiment, interior angle 321 may be precisely or approximately 130 degrees. The interior angle (323) that may be formed by the sixth reference line and the fourth reference line may measure within 10 degrees of perpendicular. In a preferred embodiment, interior angle 323 may be precisely or approximately 90 degrees.

Figure 4:
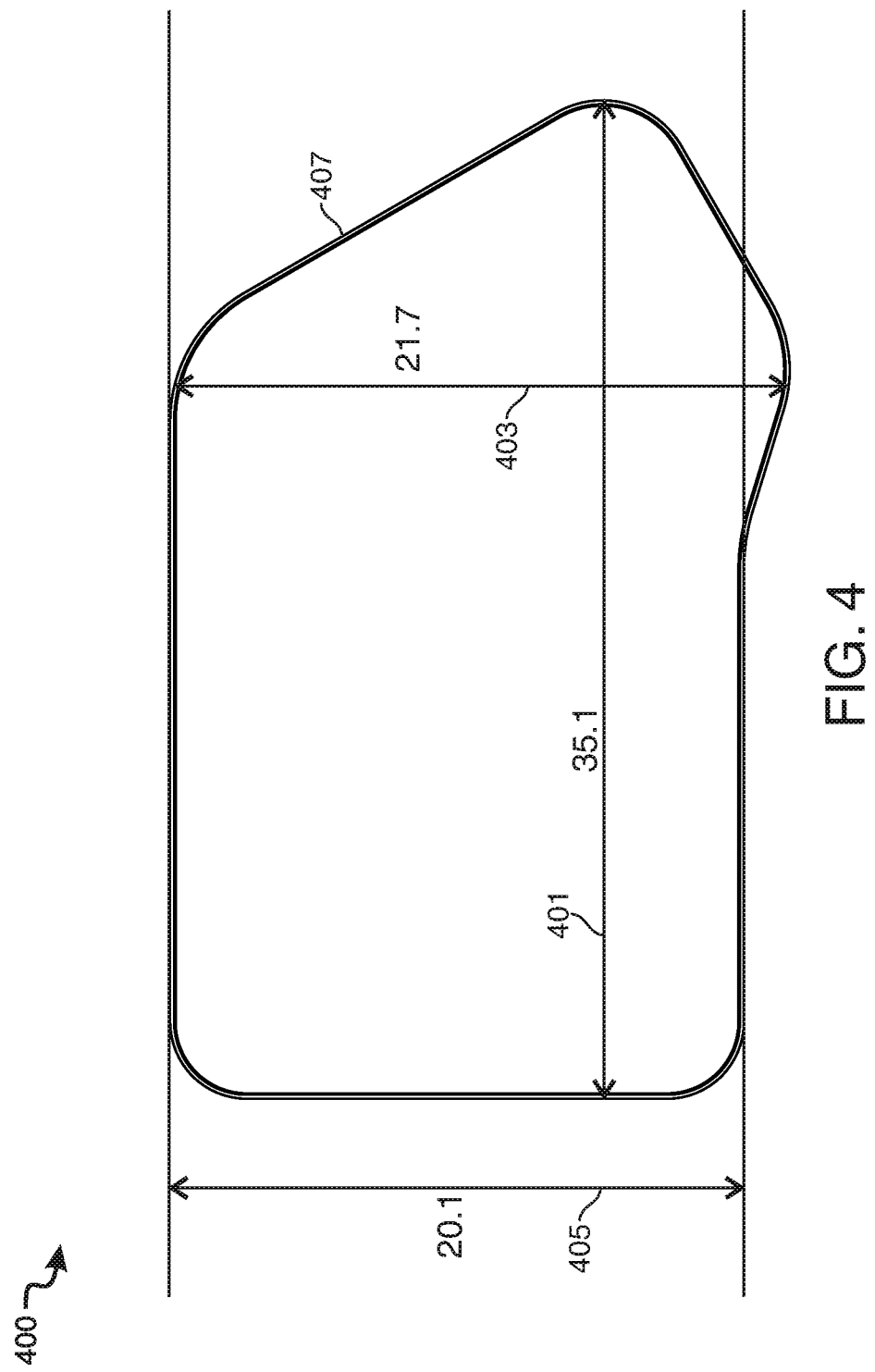
FIG. 4 shows still another illustrative apparatus in accordance with principles of the disclosure.

The collaborative desk may be associated with certain specific measurements. FIG. 4 shows a top view of illustrative desktop 400 with some exemplary measurements. The measurements may include a width (401) that may be measured as the distance between corner DF and the first reference line. The width may be in the range of 30-40 inches. In a preferred embodiment, the width may be precisely or approximately 35.1 inches. The measurements may include a depth (403) that may be measured as the distance between corner EF and the second reference line. The depth may be in the range of 15-25 inches. In a preferred embodiment, the depth may be precisely or approximately 21.7 inches. The measurements may include an intermediate depth (405) that may be measured as the distance between the second and the third reference lines. The intermediate depth may be in the range of 15-25 inches. In a preferred embodiment, the intermediate depth may be precisely or approximately 20.1 inches.

As used herein, measuring from a corner to a reference line may involve measuring the length of a line drawn perpendicular to the reference line and extending to a point of the corner that is furthest from the reference line. The point may be on the outside of the corner. In some embodiments, the desktop may be surrounded by a rim (407). The rim may have a thickness. In these embodiments, the reference line and/or the point may be on the outside of the rim and the measurements may be inclusive of the rim. Alternatively, the reference line and/or the point may be on the inside of the rim and the measurements may be exclusive of the rim. Also, usage herein of inches to describe measurements may, in some embodiments, actually represent the true dimensions being measured. In other embodiments, the measurements may merely represent preferred proportions of shapes that can be scaled larger or smaller, and are not limited to the strict measurements as described in inches.

The measurements may include a surface area of the top surface. The surface area may be between 550 and 700 square inches. One preferred embodiment may have a surface area that is precisely or approximately 624 square inches. Other exemplary embodiments may have surface areas that are precisely or approximately 586 or 615 square inches.

The collaborative desk may be configured to be usable individually and also in combination with other collaborative desks. Combinations with other collaborative desks may include formations of 2, 3, 4, or more collaborative desks.

Figure 5A:
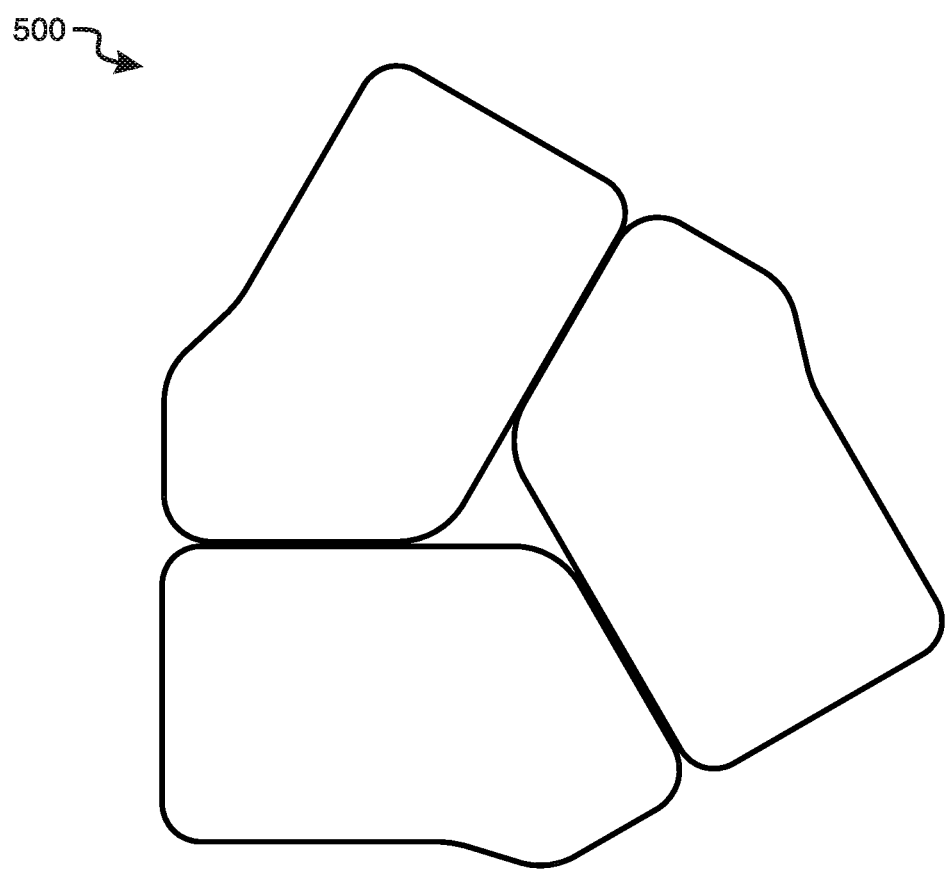
FIGS. 5A-B show an illustrative system in accordance with principles of the disclosure.
Figure 5B:
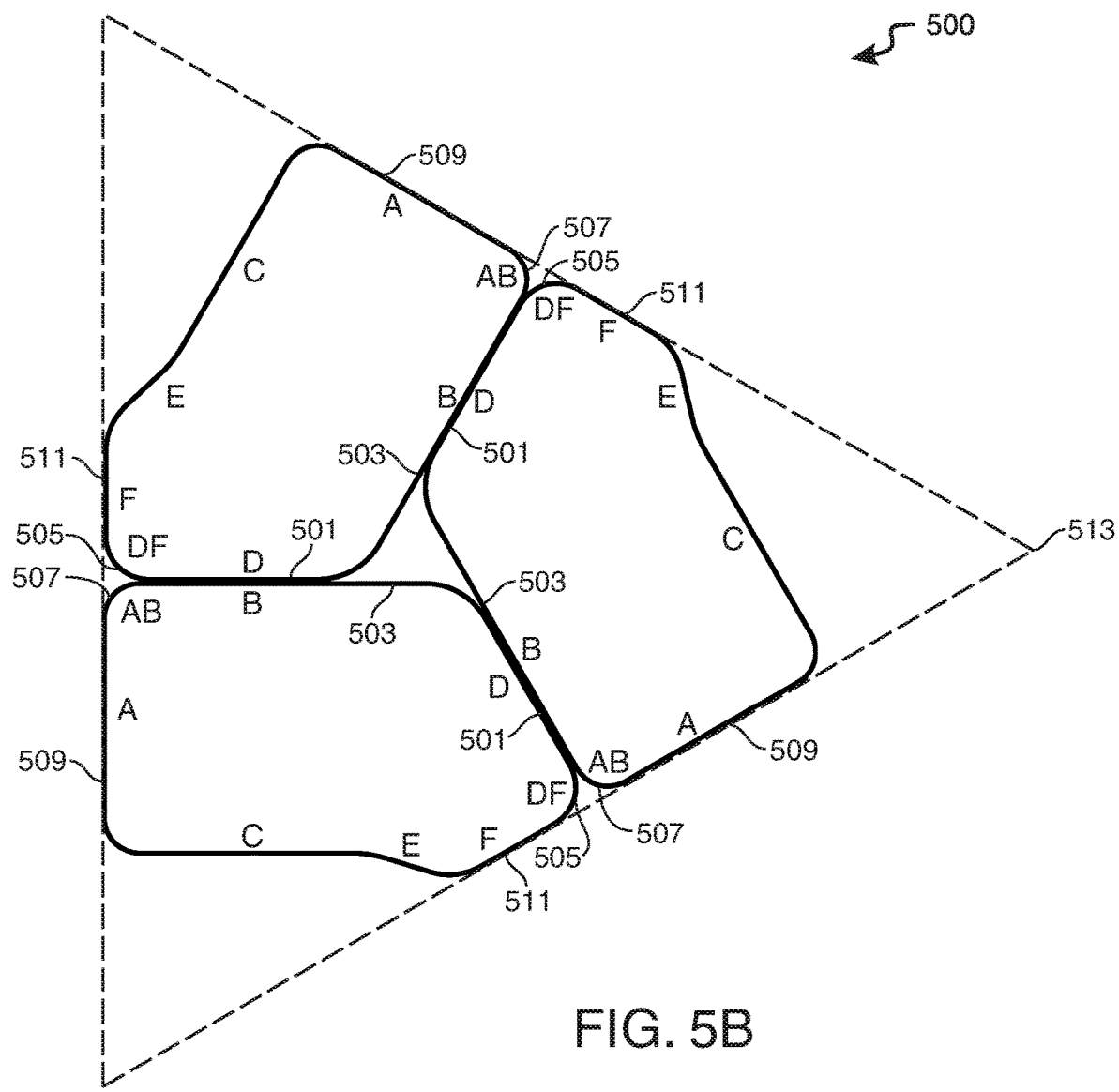

FIGS. 5A and 5B show a top view of illustrative formation 500 of three collaborative desks. Edge D (501) of each of the three collaborative desks may be positioned proximal to and at least partially flush with edge B (503) of an adjacent one of the three collaborative desks. Corner DF (505) of each of the three collaborative desks may be positioned proximal to corner AB (507) of an adjacent one of the three collaborative desks. The first reference line (509) of each of the three collaborative desks may be substantially collinear with the sixth reference line (511) of an adjacent one of the three collaborative desks to form a conjoined reference line. The formation may form three conjoined reference lines. The three conjoined reference lines may form a triangle (513).

Figure 6A:
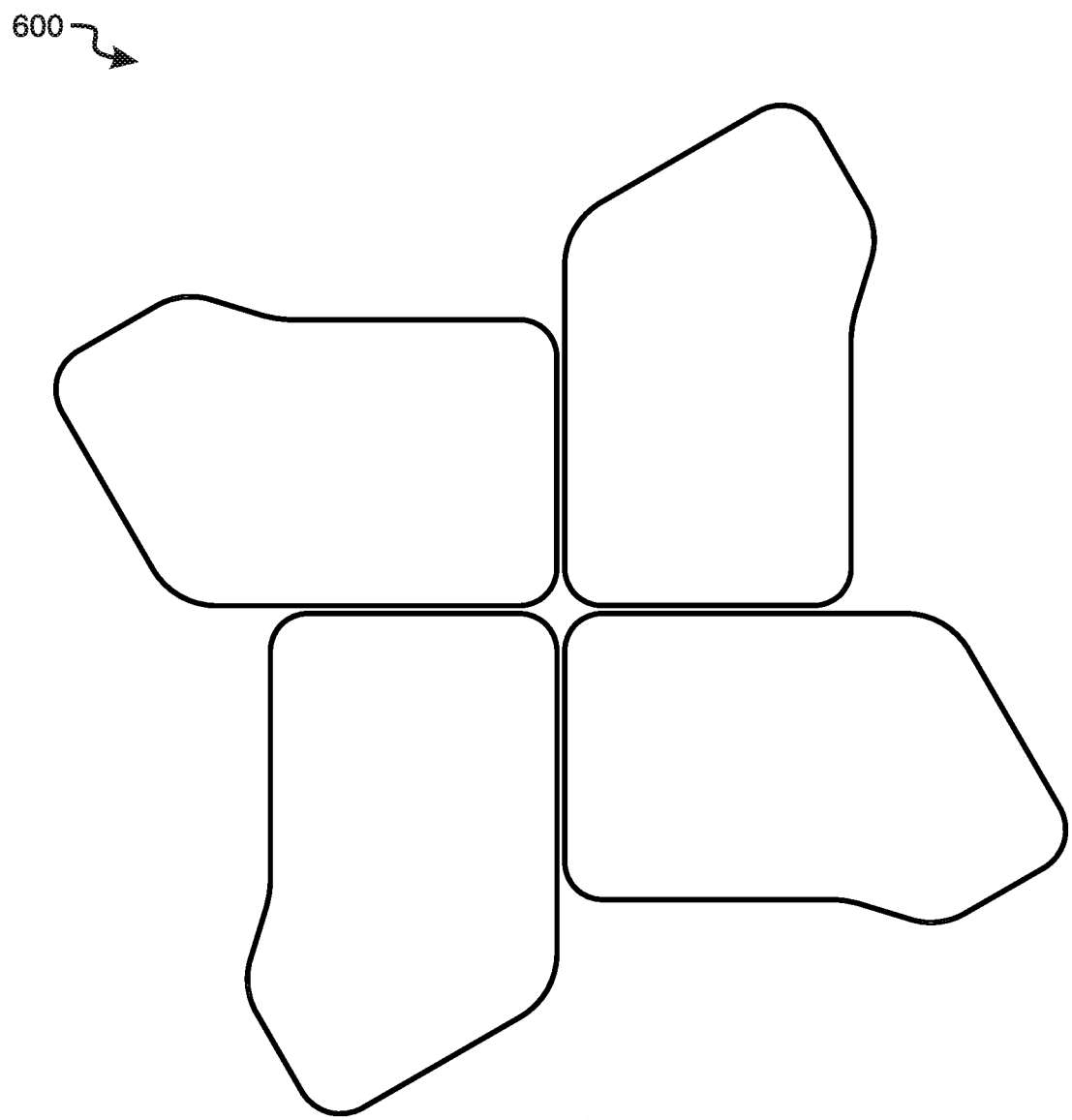
FIGS. 6A-B show another illustrative system in accordance with principles of the disclosure.
Figure 6B:
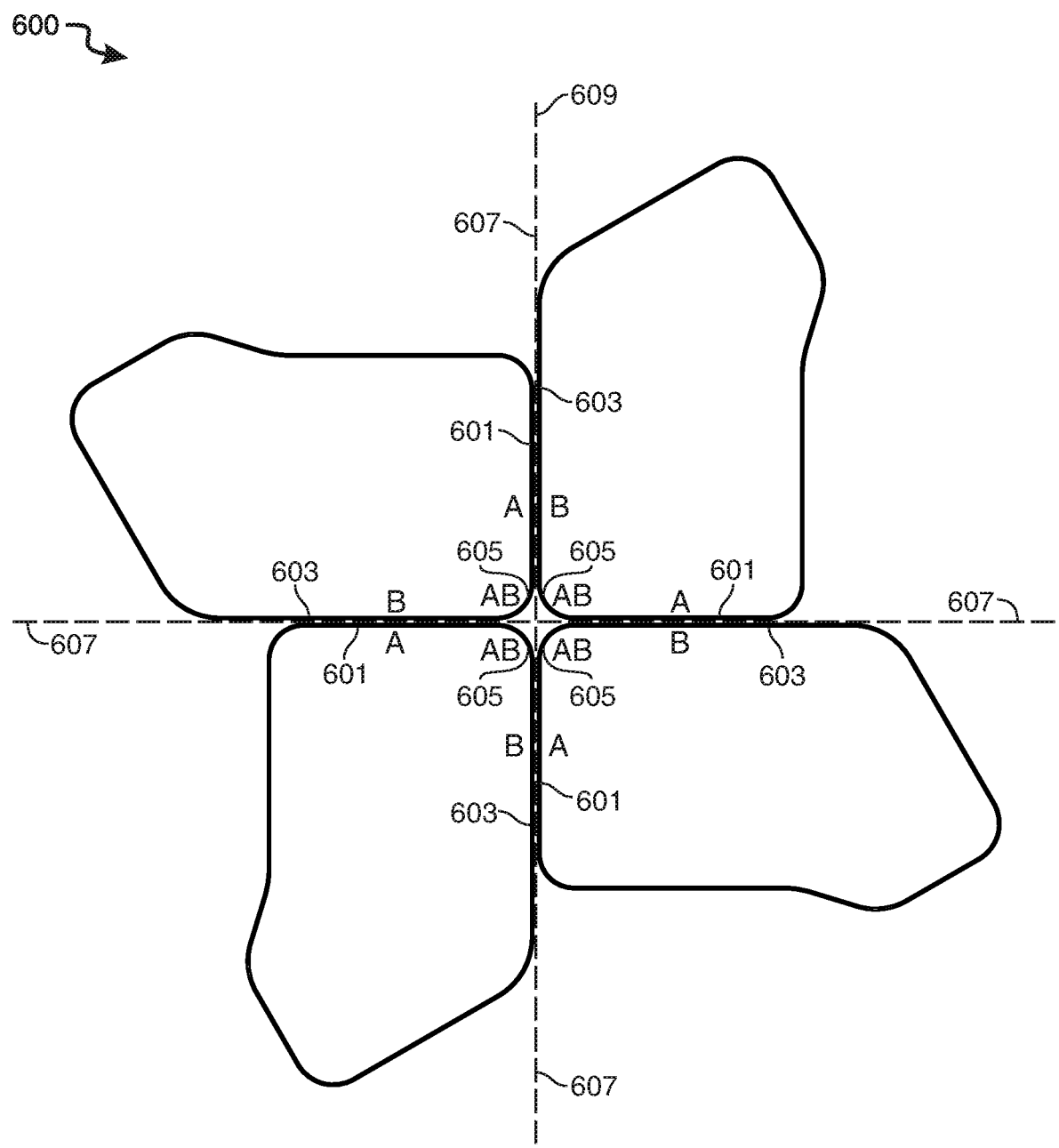

FIGS. 6A and 6B show a top view of illustrative formation 600 of four collaborative desks. Edge A (601) of each of the four collaborative desks may be positioned proximal to and at least partially flush with edge B (603) of an adjacent one of the four collaborative desks. Corners AB (605) of all the four collaborative desks may be positioned proximal to each other at the center of the formation. The first reference line of each of the four collaborative desks may be substantially collinear with the second reference line of an adjacent one of the four collaborative desks to form a conjoined reference line. The formation may form four conjoined reference lines (607), two pairs of which may be collinear with each other. The two pairs of collinear conjoined reference lines may be substantially perpendicular with each other. The four conjoined reference lines may thus form a cruciform shape (609).

Figure 7:
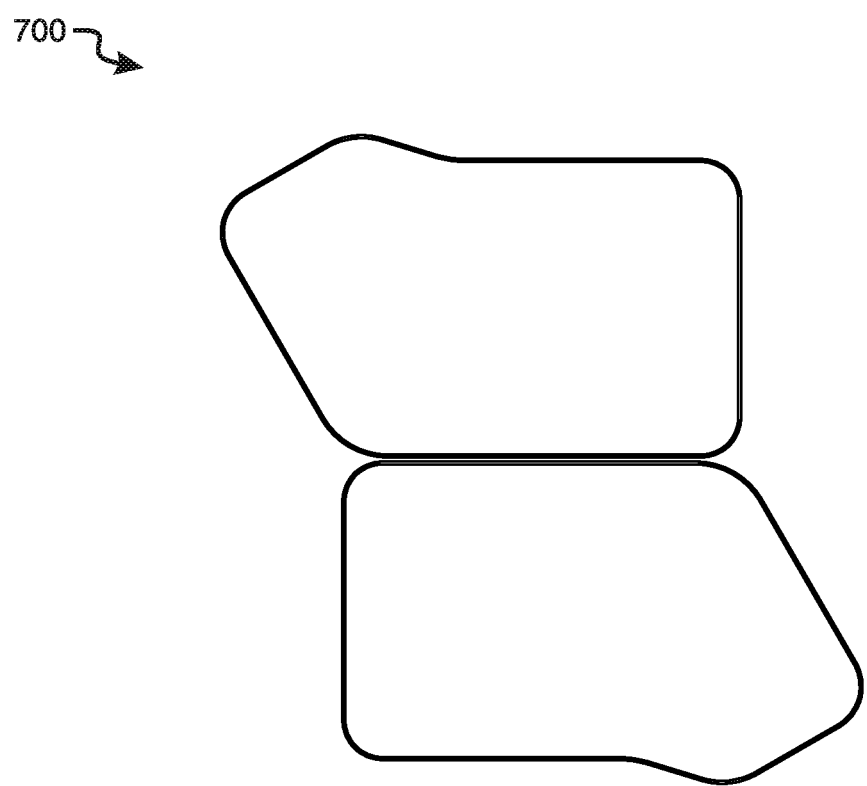
FIG. 7 shows yet another illustrative system in accordance with principles of the disclosure.
Figure 8:
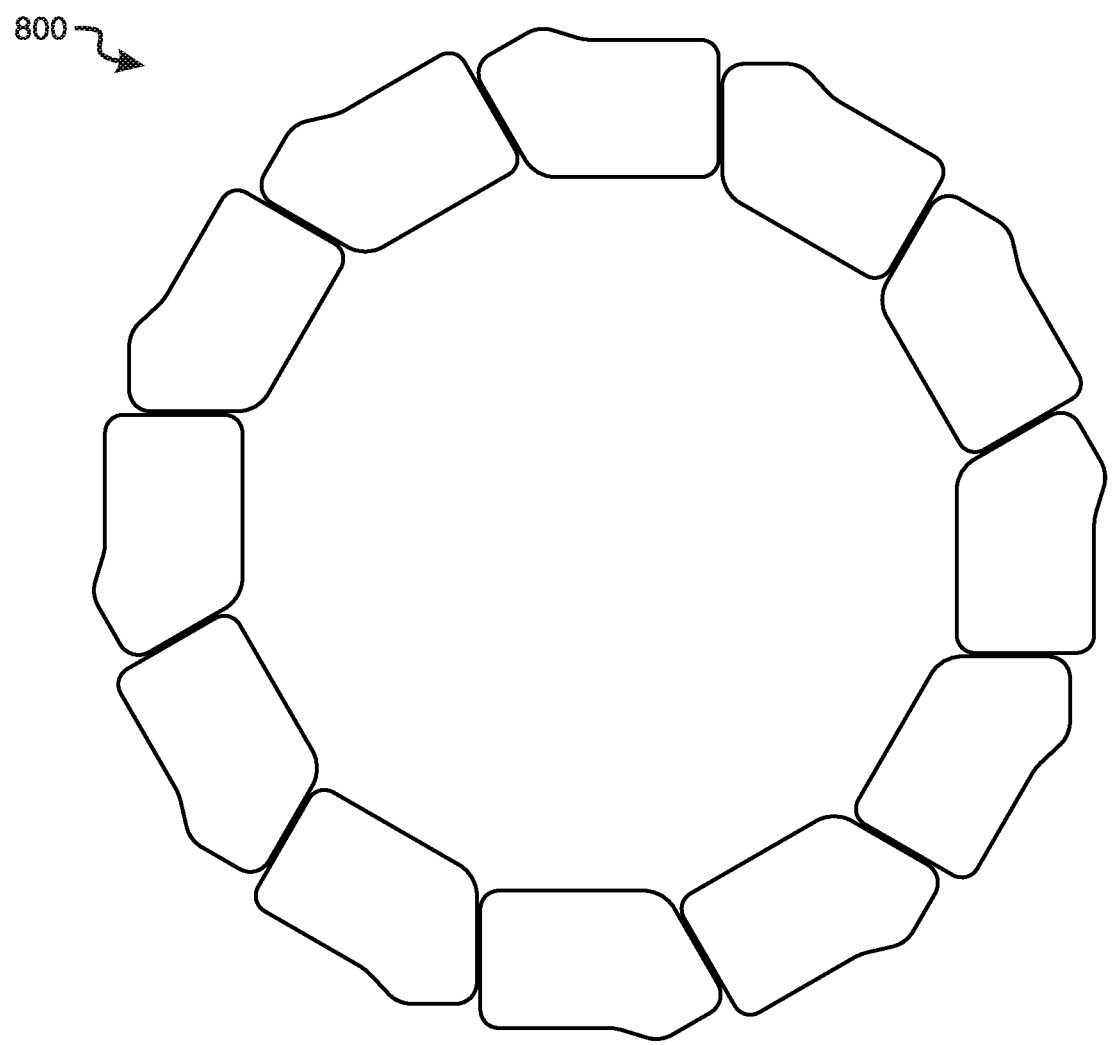
FIG. 8 shows still another illustrative system in accordance with principles of the disclosure.

The collaborative desk may be configured to be usable with other formations of other numbers of collaborative desks. For example, FIG. 7 shows a top view of illustrative formation 700 of two collaborative desks. FIG. 8 shows a top view of illustrative formation 800 of twelve collaborative desks.

Figure 9:
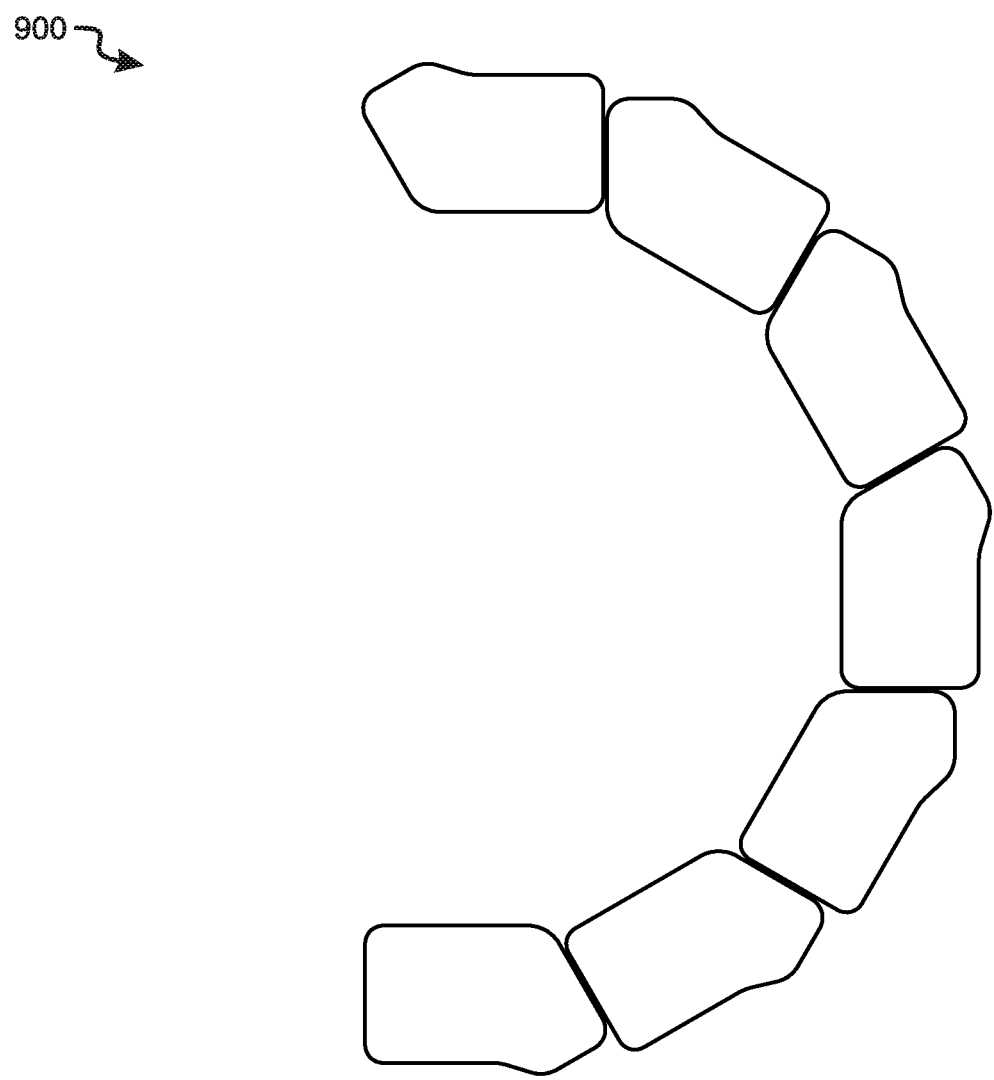
FIG. 9 shows another illustrative system in accordance with principles of the disclosure.

Some formations may include an arrangement of collaborative desks that does not close on itself. These arrangements may form a semicircle-like shape. FIG. 9 shows a top view of illustrative formation 900 of six collaborative desks that form a semicircle-like shape. A semicircle-like shape may be useful in an environment like a classroom where collaboration may be important along with the ability of a primary instructor (or team lead, etc.) to command the attention of other desk users.

These are but some exemplary formations enabled by the modular system of collaborative desks. The unique design of the collaborative desk may enable other useful formations and arrangements not shown.

In some embodiments where the combinations with other collaborative desks comprises a formation of desks, a footprint of the formation may be more efficient than a footprint of a similar arrangement of conventional desks. A conventional desk may be rectangular. The conventional desk may have a surface area equivalent to a surface area of the collaborative desks. The footprint of the formation of collaborative desks may be smaller than the similar arrangement of conventional desks. The footprint of the formation may create less dead space. The footprint of the formation may be a shape that may maximize the number of formations that can fit into a limited space, thereby being more efficient than a formation of conventional desks.

For example, an arrangement of three conventional rectangular desks in a triangular formation may leave a large gap in the center of the triangle which is unusable dead space. This may cause the footprint triangular formation to be large, which will limit the number of triangular formations that can fit in a limited space. Moreover, the large gap in the center will cause the users at each of the desks to be far apart from each other. By contrast, a formation of three collaborative desks, such as formation 500 shown in FIGS. 5A and 5B, may have less dead space, a smaller footprint, and closer proximity between users.

The desktop may be supported by a plurality of legs. The legs may provide the collaborative desk with a height. The height may be in the range between 20 and 50 inches. The height may conform to industry standards for any category of use in which the collaborative desk may be deployed. For example, the collaborative desk may be configured as a standard sitting desk, a children's desk, a standing desk, or any other suitable category of desk usage. In a preferred embodiment, the collaborative desk may have a height of precisely or approximately 26 inches. In other embodiments, the collaborative desk may have a height of precisely or approximately 29 inches. In a preferred embodiment, the desktop may be supported by four legs.

Figure 10A:
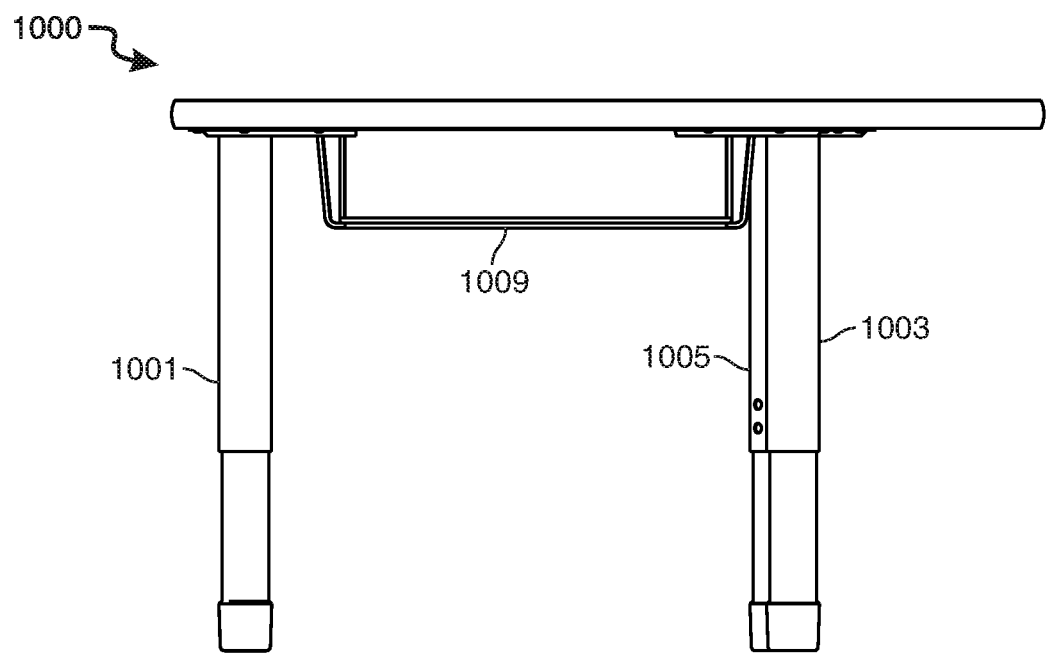
FIGS. 10A-C show an illustrative apparatus in accordance with principles of the disclosure.

FIG. 10A shows a side view of illustrative collaborative desk 1000. The side view shows one exemplary arrangement of desk legs 1001-1005. Collaborative desk 1000 may also include a fourth leg 1007 that may not be visible behind leg 1001.

In some embodiments, the collaborative desk may include book-box 1009. A book-box may be a compartment for storage. A book-box may be especially useful in an educational environment such as a school. In some embodiments, the book-box may be installed underneath the desktop. The book-box may be positioned to be usable by a user facing edge C. The side-view shown in FIG. 10A may be facing edge C of the desktop of collaborative desk 1000.

Figure 10B:
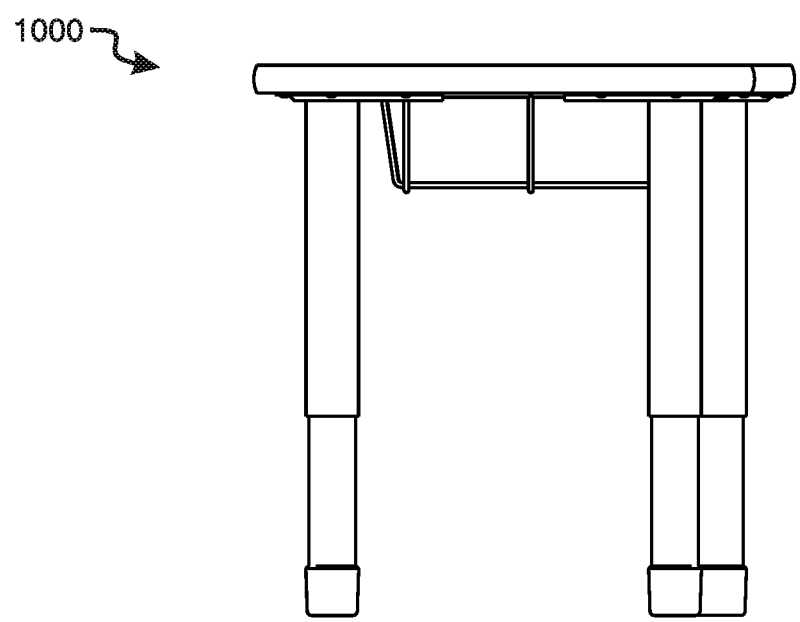
Figure 10C:
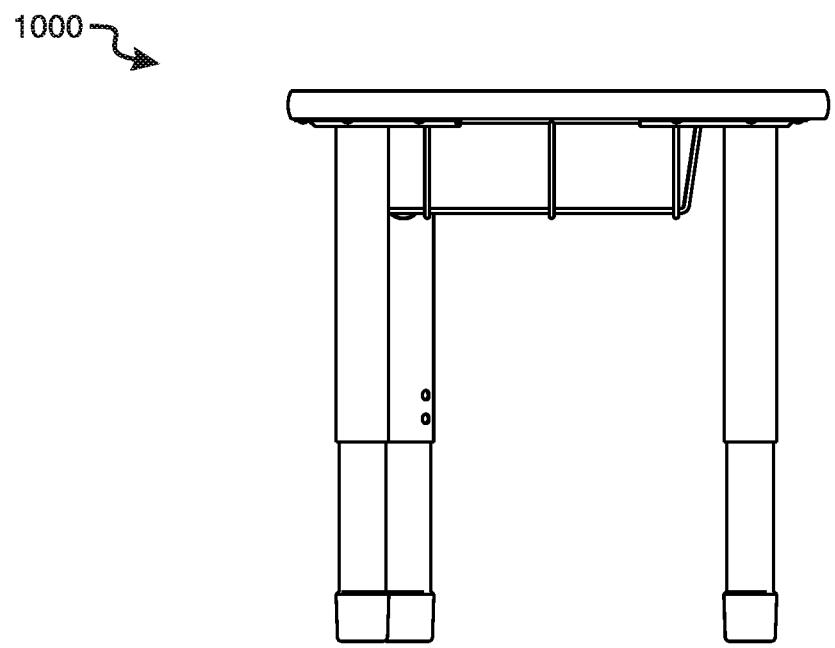

FIG. 10B shows another side view of illustrative collaborative desk 1000. The side-view shown in FIG. 10B may be facing edge A of the desktop of collaborative desk 1000. FIG. 10C shows yet another side view of illustrative collaborative desk 1000. The side-view shown in FIG. 10C may be facing edges D and F of the desktop of collaborative desk 1000.

Figure 11A:
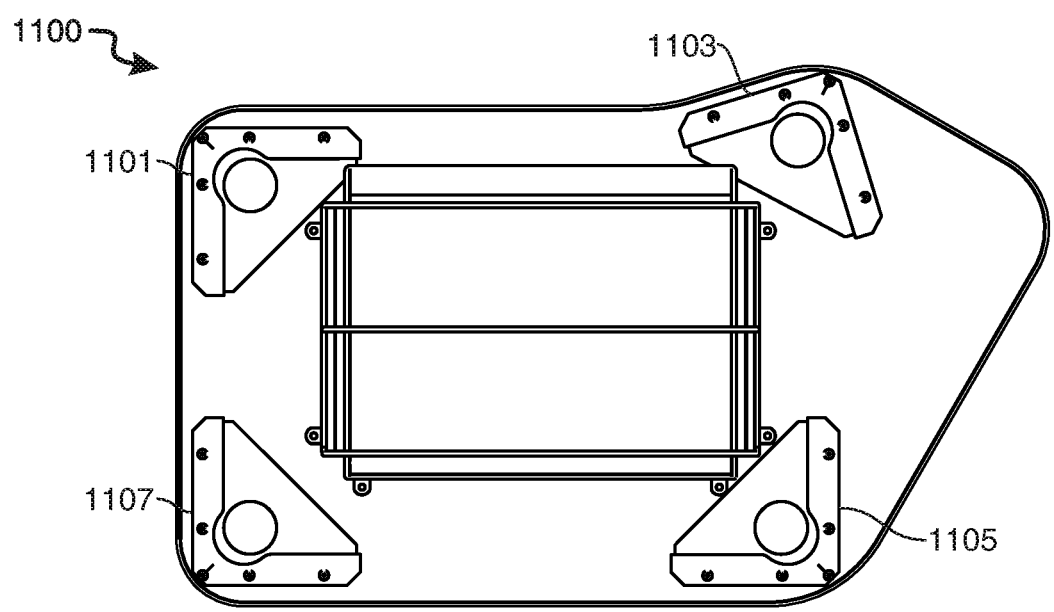
FIGS. 11A-C show another illustrative apparatus in accordance with principles of the disclosure.
Figure 11B:
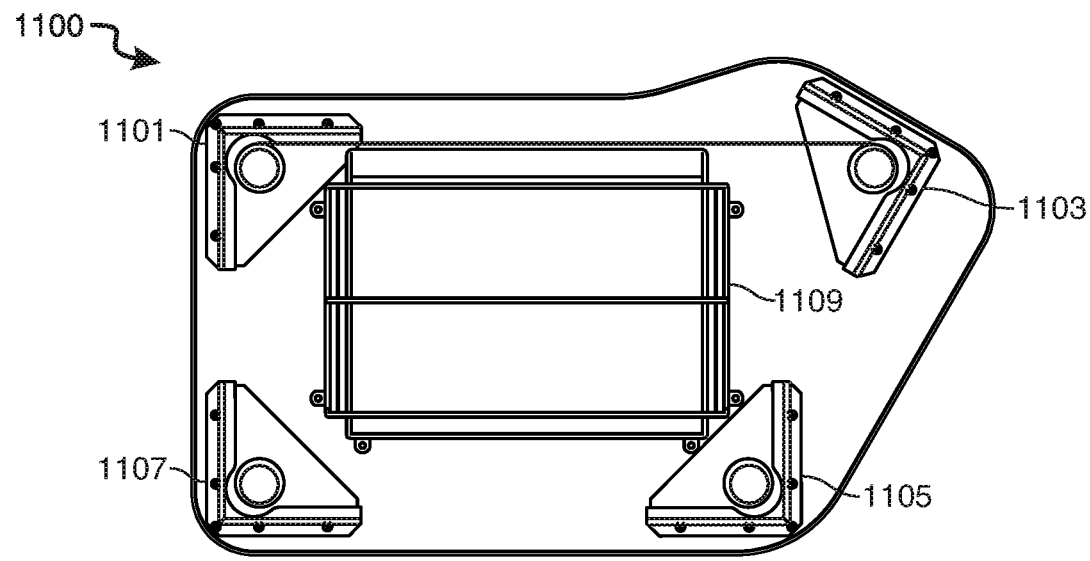
Figure 11C:
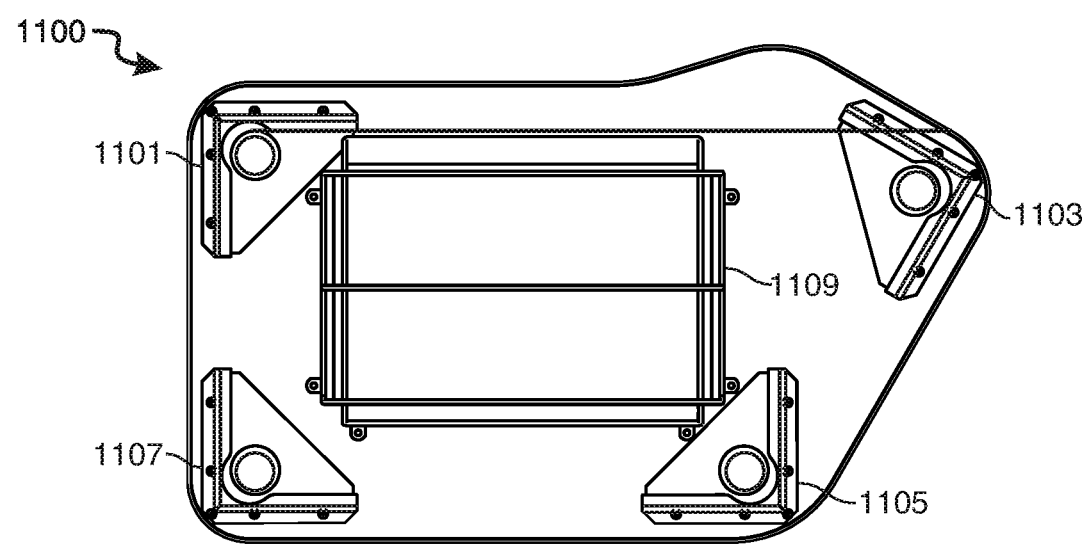

FIGS. 11A-C show bottom views of illustrative collaborative desk 1100. The bottom views shown in FIGS. 11A-C show some exemplary configurations for positioning desk legs 1101-1107. Desk legs 1101-1107 may show leg assemblies that include the leg itself as well as a bracket portion that may install into the bottom of the desktop. Considerations involved in positioning the legs include compatibility with book-box 1109, ergonomic usability, and maximization of desk stability. The exemplary position of leg 1103 shown in FIG. 11A may be a preferred option that maintains ergonomic usability and compatibility with a book-box, while maximizing desk stability.

Figure 12:
FIG. 12 shows yet another illustrative apparatus in accordance with principles of the disclosure.

FIG. 12 shows a top view of an illustrative desktop 1200. Desktop 1200 may have dimensions and/or proportions that are different from those shown for exemplary desktop 400 in FIG. 4. The dimensions of desktop 1200 may include a width, depth, and intermediate depth that are precisely or approximately 35.1, 20.8, and 18.7 inches, respectively.

Figure 13A:
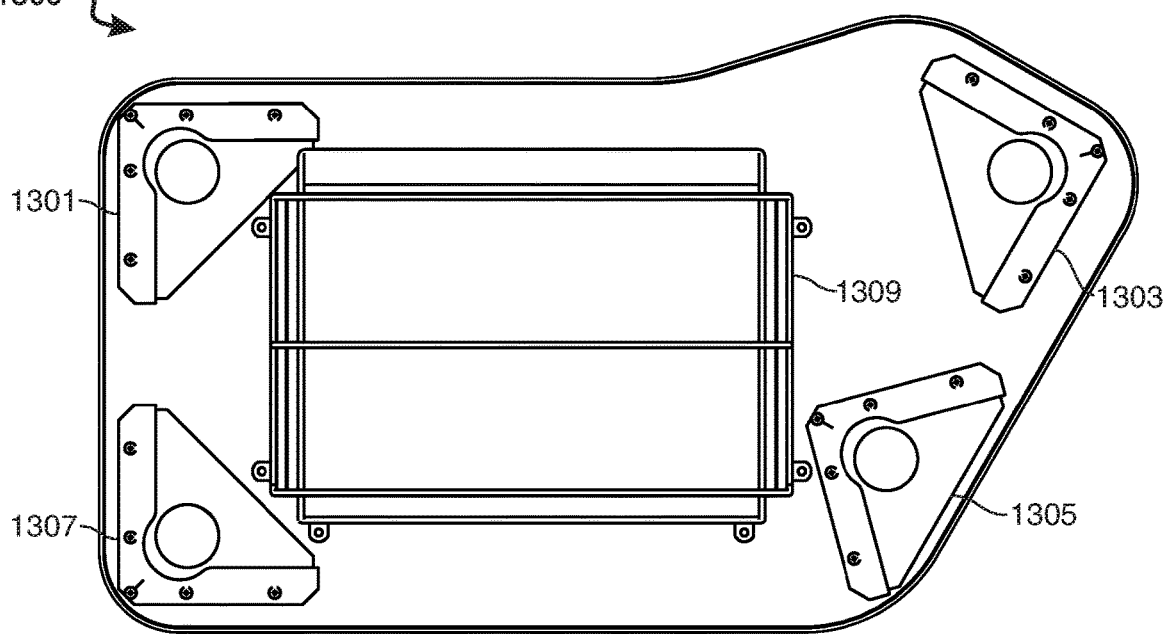
FIGS. 13A-B show still another illustrative apparatus in accordance with principles of the disclosure.
Figure 13B:
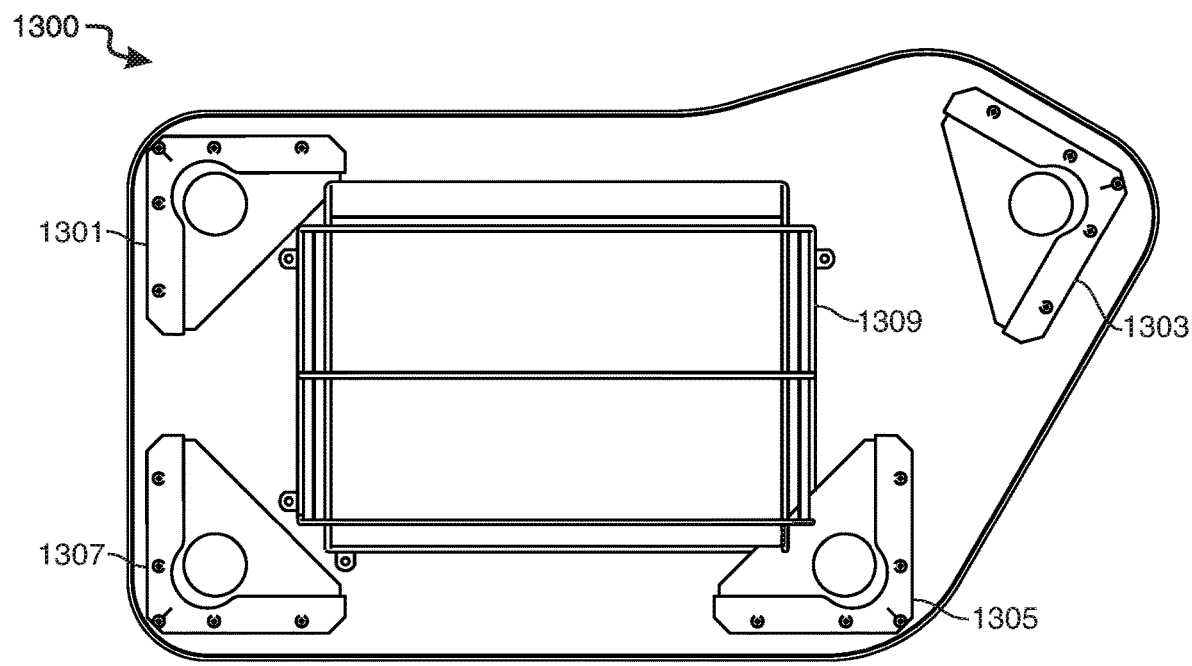

FIGS. 13A and 13B show bottom views of illustrative collaborative desk 1300. Collaborative desk 1300 may have dimensions that are the same as or similar to desktop 1200. The bottom views shown in FIGS. 13A and 13B show some exemplary configurations for positioning desk legs 1301-1307. Considerations involved in positioning the legs include compatibility with book-box 1309, ergonomic usability, and maximization of desk stability. The exemplary position of leg 1303 shown in FIG. 13B may be a preferred option that maintains ergonomic usability and compatibility with a book-box (as long as the bracket is modified to avoid the book-box), while maximizing desk stability.

The leg positions shown in FIGS. 13A and 13B may be necessitated by a desk depth that is narrower than the depth of desktop 400 shown in FIG. 4. Desktop 400 may be designed, at least in part, specifically to enable a leg position like that of leg 1103 shown in FIG. 11A, while also featuring a unique shape that enables efficient combinations in a plurality of multi-desk formations. The position of leg 1103 shown in FIG. 11A may be a preferred position that maximizes desk stability while maintaining ergonomic usability and compatibility with a book-box.

A method for rendering a collaborative desk is provided. The method may be performed on a computing device via software running on a processor and stored in non-transitory memory. In some embodiments, the software may include a CAD (Computer Aided Design) program.

The method may include forming a six-sided polygon to represent a top surface of the collaborative desk. The six sides may include sides A-F. The polygon may be configured to fit at least partially flush against other duplicate polygons in one or more formations of polygons. The formations may include formations of 2, 3, 4, and/or more polygons. In a preferred embodiment, the polygon may be configured to fit at least partially flush against other duplicate polygons in at least formations of 2, 3, and 4 polygons.

The method may include positioning a first line segment on a screen of the computing device. The first line segment may represent side A of the polygon. The first line segment may be associated with a first reference line that may be an imaginary line that is collinear with the first line segment.

The method may include positioning a second line segment on the screen such that a second reference line (an imaginary line collinear with the second line segment) is substantially perpendicular with the first reference line. The second line segment may represent side B of the polygon.

The method may include positioning a third line segment on the screen such that a third reference line (an imaginary line collinear with the third line segment) may be substantially perpendicular with the first reference line. The third line segment may represent side C of the polygon.

The method may include positioning a fourth line segment on the screen such that a fourth reference line (an imaginary line collinear with the fourth line segment) may form an obtuse interior angle with the second reference line. The fourth line segment may represent side D of the polygon.

The method may include positioning a fifth line segment on the screen such that a fifth reference line (an imaginary line collinear with the fifth line segment) may form a reflex interior angle with the third reference line. The fifth line segment may represent side E of the polygon.

The method may include positioning a sixth line segment on the screen. The sixth line segment may be positioned between the fourth and fifth line segments. The sixth line segment may be associated with a sixth reference line that may be an imaginary line that is collinear with the sixth line segment. The sixth line segment may represent side F of the polygon.

The method may include joining the six line segments at six corners. The six corners may include five exterior corners and one interior corner. A first corner may join the first and second line segments. The first corner may be one of the exterior corners. A second corner may join the first and third line segments. The second corner may be one of the exterior corners. A third corner may join the second and fourth line segments. The third corner may be one of the exterior corners. A fourth corner may join the third and fifth line segments. The fourth corner may be the interior corner.

A fifth corner may join the fourth and sixth line segments. The fifth corner may be one of the exterior corners. A sixth corner may join the fifth and sixth line segments. The sixth corner may be one of the exterior corners.

Figure 14:
FIG. 14 shows another illustrative apparatus in accordance with principles of the disclosure.

In some embodiments, one or more of the corners may be rounded. Furthermore, one or more of the rounded corners may be associated with a measure of roundedness. Roundedness may be measured in various ways. One method of measuring roundedness may include measuring the radii of an oval of which the corner is a part. For example, FIG. 14 shows a top view of illustrative desktop 1400 that has dimensions similar to desktop 400 shown in FIG. 4. FIG. 14 shows r1 (1401) and r2 (1403) which are radii of a circle of which corner AC forms a part. In one preferred embodiment, the measurements of both r1 and r2 may be precisely or approximately 2.690 inches (or other suitable units used in measuring the polygon and/or desktop). In some embodiments, the roundedness of corner AB may also be precisely or approximately r1=2.690 inches and r2=2.690 inches, substantially the same as the roundedness of corner AC. In certain embodiments, the roundedness measurements of the other corners may include one or more of the following: r1 and r2 may be precisely or approximately 3.190 inches for corner DF, r1 and r2 may be precisely or approximately 5.190 inches for corner BD, r1 and r2 may be precisely or approximately 4.727 inches for corner EF, and/or r1 and r2 may be precisely or approximately 7.155 inches for corner CE.

The method may include forming a formation of three polygons. Forming the formation of three polygons may include positioning side D of each of the three polygons proximal to and at least partially flush with side B of an adjacent one of the three polygons. Forming the formation of three polygons may also include positioning the fifth corner of each of the three polygons proximal to the first corner of an adjacent one of the three polygons. In the formation of three polygons, the first reference line of each of the three polygons may be substantially collinear with the sixth reference line of an adjacent one of the three polygons to form a conjoined reference line. The formation may form three conjoined reference lines, and the three conjoined reference lines may form a triangle.

The method may include forming a formation of four polygons. Forming the formation of four polygons may include positioning side A of each of the four polygons proximal to and at least partially flush with side B of an adjacent one of the four polygons. Forming the formation of four polygons may also include positioning the first corners of all of the four polygons proximal to each other at the center of the formation. In the formation of four polygons, the first reference line of each of the four polygons may be substantially collinear with the second reference line of an adjacent one of the four polygons to form a conjoined reference line. The formation may thereby form four conjoined reference lines, two pairs of which are collinear with each other. The two pairs of collinear conjoined reference lines may be substantially perpendicular with each other. The four conjoined reference lines may thus form a cruciform shape.

In some embodiments of the method, the polygon may be associated with certain specific dimensions. The dimensions may include a width. The width may be measured as the distance between the fifth corner and the first reference line. The width may preferably be in the range of 33-38 units. A unit may be any suitable unit used for measurement. A unit may be a set number of pixels. A unit may represent an inch.

The dimensions may include a depth. The depth may be measured as the distance between the sixth corner and the second reference line. The depth may preferably be in the range of 19-24 units. The dimensions may include an intermediate depth. The intermediate depth may be measured as the distance between the second and third reference lines. The intermediate depth may preferably be in the range of 18-23 units.

In some embodiments of the method, the polygon may be associated with certain specific angles. For example, the obtuse interior angle that may be formed by the fourth reference line and the second reference line may preferably measure between 110 and 130 degrees. The reflex interior angle that may be formed by the fifth reference line and the third reference line may preferably measure between 190 and 210 degrees. Furthermore, the sixth reference line may form an obtuse interior angle with the fifth reference line that may preferably measure between 120 and 140 degrees. The sixth reference line may also form an interior angle with the fourth reference line that may preferably measure within 10 degrees of perpendicular.

The steps of methods may be performed in an order other than the order shown and/or described herein. Embodiments may omit steps shown and/or described in connection with illustrative methods. Embodiments may include steps that are neither shown nor described in connection with illustrative methods.

Illustrative method steps may be combined. For example, an illustrative method may include steps shown in connection with another illustrative method.

Apparatus may omit features shown and/or described in connection with illustrative apparatus. Embodiments may include features that are neither shown nor described in connection with the illustrative apparatus. Features of illustrative apparatus may be combined. For example, an illustrative embodiment may include features shown in connection with another illustrative embodiment.

The drawings show illustrative features of apparatus and methods in accordance with the principles of the invention. The features are illustrated in the context of selected embodiments. It will be understood that features shown in connection with one of the embodiments may be practiced in accordance with the principles of the invention along with features shown in connection with another of the embodiments.

One of ordinary skill in the art will appreciate that the steps shown and described herein may be performed in other than the recited order and that one or more steps illustrated may be optional. The methods of the above-referenced embodiments may involve the use of any suitable elements, steps, computer-executable instructions, or computer-readable data structures. In this regard, other embodiments are disclosed herein as well that can be partially or wholly implemented on a computer-readable medium, for example, by storing computer-executable instructions or modules or by utilizing computer-readable data structures.

Thus, apparatus and methods for a modular collaborative desk system are provided. Persons skilled in the art will appreciate that the present invention can be practiced by other than the described embodiments, which are presented for purposes of illustration rather than of limitation, and that the present invention is limited only by the claims that follow.

What is claimed is:

1. A collaborative desk configured to be usable alone and in a plurality of combinations with other collaborative desks, said collaborative desk comprising:
    a top surface bound by six edges, each edge of the six edges defining a reference line, said reference line being an imaginary line drawn along said edge, the six edges comprising:
        edge A defining a first reference line;
        edge B defining a second reference line that is within 5 degrees of perpendicular to the first reference line;
        edge C defining a third reference line that is within 5 degrees of perpendicular to the first reference line;
        edge D defining a fourth reference line that forms an obtuse interior angle with the second reference line;
        edge E defining a fifth reference line that forms a reflex interior angle with the third reference line; and
        edge F defining a sixth reference line that forms an obtuse interior angle with the fifth reference line and an interior angle within 10 degrees of perpendicular with the fourth reference line;
    wherein:
        the collaborative desk is configured to be used by a user facing edge C, and edges A, B, and C encompass a primary portion of the top surface, and edges D, E, and F encompass an extension flange portion of the top surface, said extension flange providing additional workspace adjacent to the primary portion; and
        one of the combinations with other collaborative desks comprises a formation of four collaborative desks, wherein:
            edge A of each of the four collaborative desks is positioned proximal to and at least partially flush with edge B of an adjacent one of the four collaborative desks;
            the first reference line of each of the four collaborative desks is substantially collinear with the second reference line of an adjacent one of the four collaborative desks to form a conjoined reference line; and
            the formation forms four conjoined reference lines, two pairs of which are collinear with each other and the two pairs of collinear conjoined reference lines are substantially perpendicular with each other.

2. The collaborative desk of claim 1, wherein one of the combinations with other collaborative desks comprises a formation of three collaborative desks, wherein:
    edge D of each of the three collaborative desks is positioned proximal to and at least partially flush with edge B of an adjacent one of the three collaborative desks;
    the first reference line of each of the three collaborative desks is substantially collinear with the sixth reference line of an adjacent one of the three collaborative desks to form a conjoined reference line; and
    the formation forms three conjoined reference lines, and the three conjoined reference lines form a triangle.

3. The collaborative desk of claim 1, wherein the combinations with other collaborative desks comprise formations of desks, and a footprint of at least one of the formations is smaller and/or more efficient than a footprint of a similar formation of rectangular desks that have a surface area equivalent to a surface area of the collaborative desks.

4. The collaborative desk of claim 1, comprising a surface area in the range of 615-630 square inches.

* * * * *